United States Patent [19]

Leach

[11] Patent Number: 4,459,565

[45] Date of Patent: Jul. 10, 1984

[54] LOW CURRENT ELECTRONIC OSCILLATOR SYSTEM

[75] Inventor: Jerald G. Leach, Houston, Tex.

[73] Assignee: Texas Instruments Incorporated, Dallas, Tex.

[21] Appl. No.: 417,730

[22] Filed: Sep. 13, 1982

Related U.S. Application Data

[63] Continuation of Ser. No. 157,619, Jun. 9, 1980, abandoned.

[51] Int. Cl.³ .............................................. H03B 5/36
[52] U.S. Cl. .............................. 331/116 FE; 368/159
[58] Field of Search ........ 331/116 FE, 116 R, 117 R, 331/117 FE; 368/159

[56] References Cited

U.S. PATENT DOCUMENTS

| | | | |
|---|---|---|---|
| 3,887,881 | 6/1975 | Hoffmann | 331/116 FE X |
| 4,060,772 | 11/1977 | Yamada et al. | 331/116 FE |
| 4,106,278 | 8/1978 | Yasuda | 331/116 FE X |

*Primary Examiner*—Siegfried H. Grimm

*Attorney, Agent, or Firm*—Rene' E. Grossman; Leo N. Heiting; Melvin Sharp

[57] ABSTRACT

A low current electronic oscillator system includes an oscillator tuning element, such as a piezoelectric crystal, operable at a predetermined frequency and an oscillator control circuit for cooperating with the tuning element to provide an oscillating electrical signal at the predetermined frequency. The control circuit includes first and second electrical charge storage devices coupled to a first portion of the tuning element; a first current drive device connectable to a first terminal of an applied electric potential and responsive to a first voltage on the first charge storage device for applying a first drive current to a second portion of the tuning element; and a second current drive device connectable to a second terminal of the electric potential and responsive to a second voltage on the second charge storage device for applying a second drive current to the second portion of the tuning element. The voltages on the first and second storage devices are maintained at different levels to inhibit the flow of current between the first and second terminals of the electric potential during oscillator operation.

2 Claims, 5 Drawing Figures

LOW CURRENT ELECTRONIC OSCILLATOR SYSTEM

This is a continuation of application Ser. No. 157,619, filed June 9, 1980 and now abandoned.

BACKGROUND OF THE INVENTION

This invention relates to electronic oscillators and in particular to an electronic oscillator in which current consumption is minimized.

Electronic oscillators, such as a crystal oscillator comprising a piezoelectric crystal and an amplifier element, are well known in the art. Examples of such oscillators are shown in U.S. Pat. Nos. 3,375,466 and 4,039,973. Crystal oscillators tuned to a particular frequency, such as, for example, 32.768 KHz, are typically used in electronic devices such as calculators and watches to provide the requisite clocking signals for the operation of the devices.

One problem associated with small, battery-powered devices, such as electronic wristwatches, is that of reducing the current consumption of the electronic circuitry to enhance the lifetime of the battery power supply. Oscillators used in electronic watches typically draw on the order of 1-2 microamps of current.

Prior art approaches to reducing the current consumption in electronic oscillator systems have generally involved the use of high impedance electrical resistors to prevent direct current from flowing between the positive and negative terminals of the voltage power supply for the oscillator system. Although direct current loss is somewhat minimized, the use of these resistors has the undesirable effect of reducing the oscillator gain, which increases the start-up time of the oscillator system, and increasing the output impedance, which makes the oscillator system more susceptible to random noise gliches.

SUMMARY OF THE INVENTION

It is therefore one object of the present invention to provide an improved electronic oscillator system having minimum current consumption.

It is another object of the present invention to provide a crystal oscillator in which direct current is inhibited from flowing between the positive and negative voltage terminals of the oscillator power supply without inhibiting the gain of the oscillator.

It is a further object of the invention to provide a low current oscillator for use in battery-powered electronic devices, such as electronic watches and calculators.

These and other objects are accomplished in accordance with the present invention wherein an electronic oscillator system is comprised of an oscillator tuning element operable at a predetermined frequency and an oscillator control circuit for cooperating with the tuning element for providing an oscillating electrical signal at the predetermined frequency. The control circuit includes first electrical charge storage means connectable to a first portion of the tuning element and second electrical charge storage means coupled to the first storage means; first current drive means connectable to a first terminal on an applied electric potential and responsive to a first voltage on the first storage means for applying a first drive current to a second portion of the tuning element; and second current drive means connectable to a second terminal of the electric potential and responsive to a second voltage on the second storage means for applying a second drive current to the tuning element. The voltages on the first and second storage means are maintained at different levels to inhibit the flow of current between the first and second terminals of the electric potential during oscillator operation.

In one embodiment, the first current drive means is comprised of first current source means connectable to the first terminal of the electric potential and responsive to the first voltage on the first storage means for applying a first electrical signal to the first storage means at a level determined by the first voltage; and first current mirror means connectable to the first terminal of the electric potential for applying the first drive current to the tuning element at a level proportional to the first electrical signal. Similarly, the second drive means is comprised of second current source means connectable to the second terminal of the electric potential and responsive to the second voltage on the second storage means for applying a second electrical signal to the second storage means at a level determined by the second voltage; and second current mirror means connectable to the second terminal of the electric potential for applying the second drive current to the tuning element at a level proportional to the second electrical signal.

In another embodiment, the tuning element is a crystal tuned to a frequency of 32.768 KHz and the control circuit includes resistive means coupled between the first and second storage means for biasing the first and second current mirror means to a particular voltage level. In another embodiment, AC signal coupling means, preferably comprised of a capacitor, is coupled between the first and second storage means for providing a low AC signal impedance path between the first and second storage means. In yet another embodiment, the control circuit includes output buffer means for providing a substantially square wave oscillator output signal.

In a preferred embodiment, the first current source means and first current mirror means are comprised of first and second N channel field effect transistors and the second current source means and second current mirror means are comprised of first and second P channel field effect transistors. The second N channel and P channel transistors amplify the current flowing through the first N channel and P channel transistors and apply electrical signals to the tuning element from the output of the control circuit.

When the oscillator system is in a steady-state condition, the voltage on the first storage means is at a voltage which is Vtn above the negative rail of the applied electric potential where Vtn is the threshold voltage of the N channel devices. Similarly, the voltage on the second storage means is at a voltage which is Vtp below the positive rail of the electric potential, where Vtp is the threshold voltage of the P channel devices. At this stage, both the N channel and P channel transistors are slightly in the ON state.

The onset of an oscillating electrical signal causes the voltage levels on the first and second storage means to oscillate so that either the N channel devices or the P channel devices, but not both, will be in an ON state. The output of the oscillator system further includes output buffer means, which is comprised of a third N channel field effect transistor and a third P channel field effect transistor, for providing a substantially square wave oscillator output signal.

The electronic oscillator system of the present invention has the advantage of reducing the amount of current consumed during normal operation and is particularly well-suited for use in a battery-powered electronic calculator or timepiece in which minimal current consumption is critical to the enhancement of battery life. The oscillator system of the present invention consumes on the order of 0.5 microamps of current as compared to 1-2 microamps for the typical oscillator presently used in an electronic timepiece or calculator. dr

DETAILED DESCRIPTION OF THE INVENTION

Figure 1:
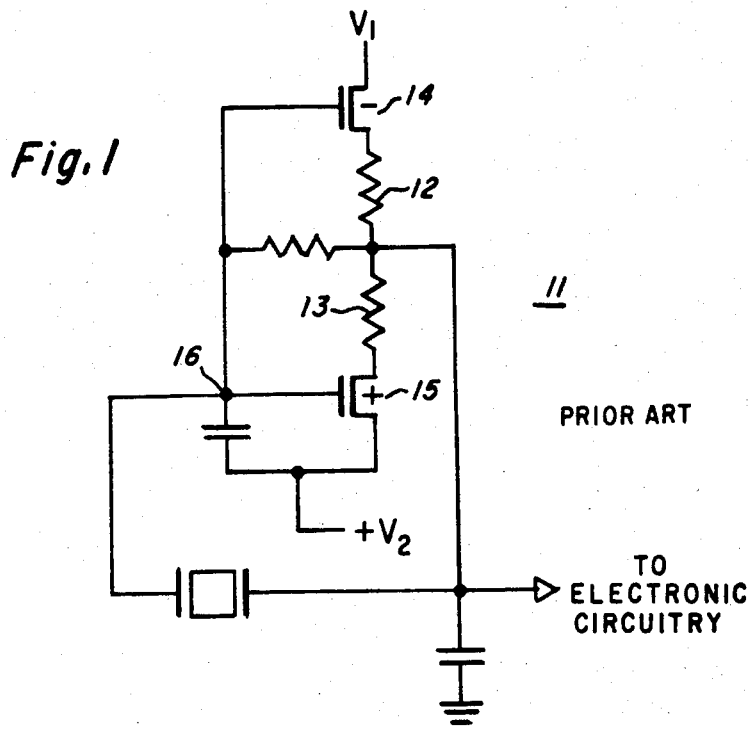
FIG. 1 is a circuit diagram of a crystal oscillator system known in the art.

FIG. 1 shows a typical prior art crystal oscillator 11 used in an electronic timepiece such as a battery-powered electronic wristwatch. Resistors 12 and 13, positioned between N channel and P channel transistors 14 and 15, respectively, are high-impedance resistors having a resistivity on the order of 300K ohms Resistors 12 and 13 minimize the amount of direct current loss between the high voltage V2 and the low voltage V1 terminals via transistors 14 and 15, but have the concomitant disadvantage of reducing the gain of oscillator 11 and increasing the start-up time thereof.

Resistors 12 and 13 are needed to minimize the direct current drain because the gates of transistors 14 and 15 are coupled to a common node 16. If a voltage appears on node 16 which is equal to or greater than V1+Vtn (where Vtn is the threshold voltage of N channel transistor 14), transistor 14 is turned on. Similarly, if a voltage appears on node 16 which is less than or equal to V2−Vtp (where Vtp is the threshold voltage of P channel transistor 15), transistor 15 is turned on. If transistors 14 and 15 are both on, i.e., when node 16 is at a voltage between V1+Vtn and V2−Vtp, direct current flows through devides 14 and 15 from V2 to V1. For example, if the power supply for oscillator 11 is a 1.5 volt battery with V1 being 0 volts and V2 being 1.5 volts and Vtn and Vtp are both 0.3 volt, N channel device 14 will be turned on when the voltage on node 16 is in the range 0.3 to 1.5 volts and P channel device 15 will be turned on when the voltage on node 16 is the range 0 to 1.2 volts. Thus when the voltage on node 16 is in the range 0.3 to 1.2 volts, both devices 14 and 15 are turned on, which causes a current drain on the system and reduces battery lifetime.

Figure 2:
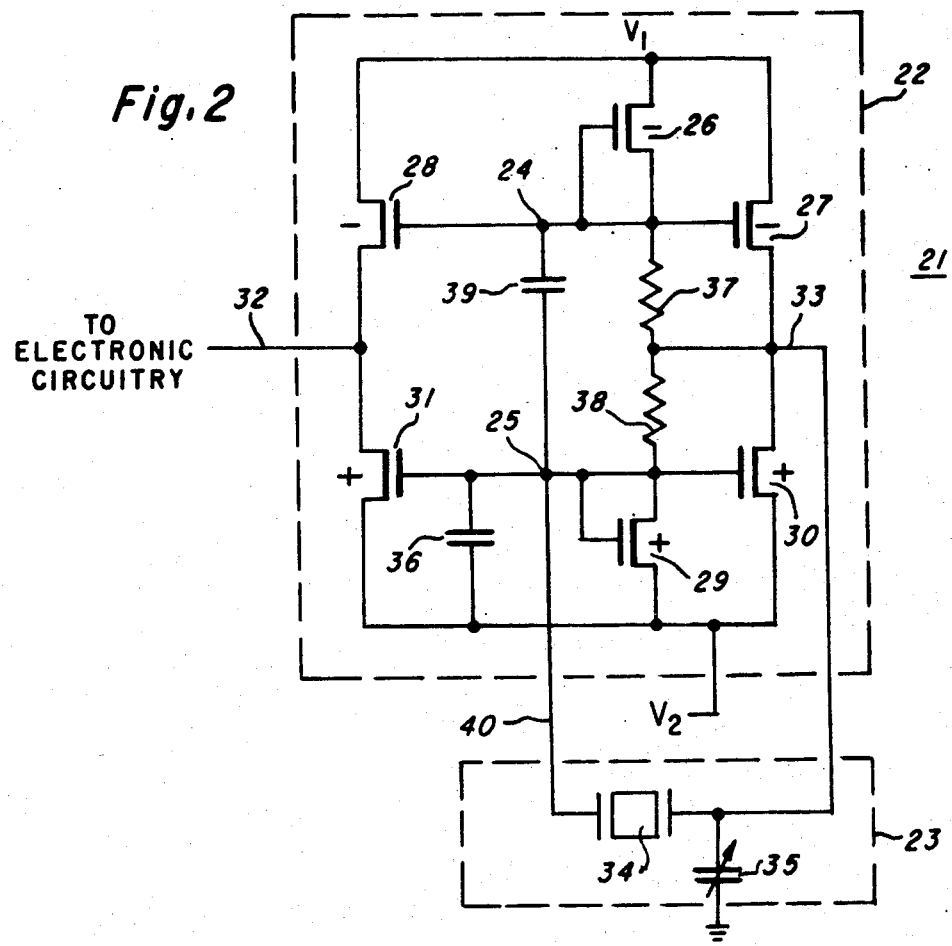
FIG. 2 is a circuit diagram of a first embodiment of a crystal oscillator system of the present invention.

The oscillator system of the present invention is shown in FIG. 2. Oscillator 21 is comprised of two major components: control circuit 22 and tuning element 23. Control circuit 22 contains two nodes 24 and 25 which serve as charge storage devices and are each coupled to the gates of three N channel field effect transistors 26, 27, and 28 and three P channel field effect transistors 29, 30, and 31, respectively. Field effect transistors 26-31 are preferably MOSFET transistors. The sources of N channel transistors 26, 27, and 28 are connected to the negative rail V1 of oscillator 21 and the sources of P channel devices 29, 30, and 31 are connected to the positive rail V2 of oscillator 21. The drains of N channel transistor 26 and P channel transistor 29 are coupled to nodes 24 and 25, respectively, and hence also to their respective gates. The drains of N channel transistor 28 and P channel transistor 31 are coupled to output 32 of oscillator 21 and the drains of N channel device 27 and P channel device 30 are coupled to output 33 of control circuit 22.

Tuning element 23 is preferably comprised of a piezoelectric crystal 34 tuned to a predetermined frequency, such as, for example, 32.768 KHz, and trimming capacitor 35 for maintaining the frequency response of crystal 34 within acceptable limits. Capacitor 36, which is included in control circuit 22, cooperates with capacitor 35 to trim the frequency of crystal 34.

The operation of oscillator 21 is as follows. Upon the application of electrical power thereto, nodes 24 and 25 will be charged to a voltage which is between V1 and V2. If the voltage on node 24 is equal to or exceeds the threshold voltage Vtn of N channel transistor 26, device 26 turns on and clamps node 24 to a voltage Vtn above the negative rail V1. N channel transistor 26 functions as a current source device for node 24. The voltage on node 24 is sufficient to turn on N channel devices 27 and 28 as well since these devices preferably have the same Vtn as device 26. Device 27 functions as a current "mirror" for device 26 and has a larger current capacity than device 26 for amplifying the electrical current flowing through device 26. Similarly, if the voltage on node 25 is less than or equal to the threshold voltage Vtp of P channel transistor 29, transistor 29 is turned on and clamps node 25 to a voltage Vtp below the positive rail V2. P channel transistor 29 serves as a current source device for node 25. The voltage on storage node 25 is sufficient to turn on devices 30 and 31 as well since these devices preferably have the same Vtp as device 29. Device 30 functions as a current mirror for device 29 and amplifies the electrical current flowing through device 29. Resistors 37 and 38 are high impedance resistors having electrical resistivity values on the order of 15-20 megohms for biasing the gates of transistors 27 and 30 to a particular voltage level and for maintaining sufficient current flow through control circuit 22 for effective oscillator operation.

Upon initial application of electrical power to oscillator 21, the voltages on nodes 24 and 25 are sufficient to turn on all of the MOS devices and direct current flows between V2 and V1. Oscillator 21 reaches a stable condition when the direct current flow through resistor 37 is approximately equal to that through resistor 38. If the resistances of resistors 37 and 38 are approximately equal, the DC voltage output on line 33 will be approximately equal to the midpoint between the voltages to which nodes 24 and 25 are clamped, i.e. between Vtn+V1 and V2−Vtp.

After oscillator 21 has reached a stable condition, the appearance of a transient AC noise signal having a frequency on the order of the crystal frequency, e.g. 32.768 KHz, will trigger an oscillation within the system. If, for example, a positive AC noise component appears on node 25, the noise is readily transferred to node 24 via capacitor 39, which serves as a low AC signal impedance path between nodes 24 and 25. The increased voltage on node 24 caused by the transient noise signal increases the voltage on the gates of N channel devices 26 and 27 so that these devices are turned on harder. Similarly, the increased voltage on node 25 caused by the positive AC signal increases the gate voltages of P channel devices 29 and 30 so that these transistors are now turned off. The result is that an AC signal is transmitted through devices 26 and 27 but no current flows through devices 29 and 30. Transistors 26 and 27 cooperate to provide a negative drive signal on output line 33, which causes a mechanical flexure of crystal 34.

When the transient noise signal dies out, crystal 34 will attempt to return to its initial state and will draw alternating current from node 25 via line 40, thereby lowering the voltage on node 25 sufficient to turn on P channel devices 29 and 30. A negative AC signal is transmitted via capacitor 39 to node 24. The decreased voltage on node 24 turns off N channel transistors 26 and 27 and turns on devices 29 and 30 so that current now flows in the opposite direction in the system. Transistors 29 and 30 cooperate to provide a positive drive signal on line 33, which causes crystal 34 to flex in the opposite direction. Crystal 34 reacts to the stress by supplying current via line 40 to nodes 24 and 25, which increases the voltage thereof and causes the oscillation cycle to continue. The signal on outputs 32 and 33 therefore switches between a positive-going and a negative-going signal during each oscillation cycle. Transistors 28 and 31, which are turned on and off in sequence with transistors 26 and 29, respectively, serve as output buffer devices to provide a square wave oscillator output signal for an external electronic circuit.

Figure 3:
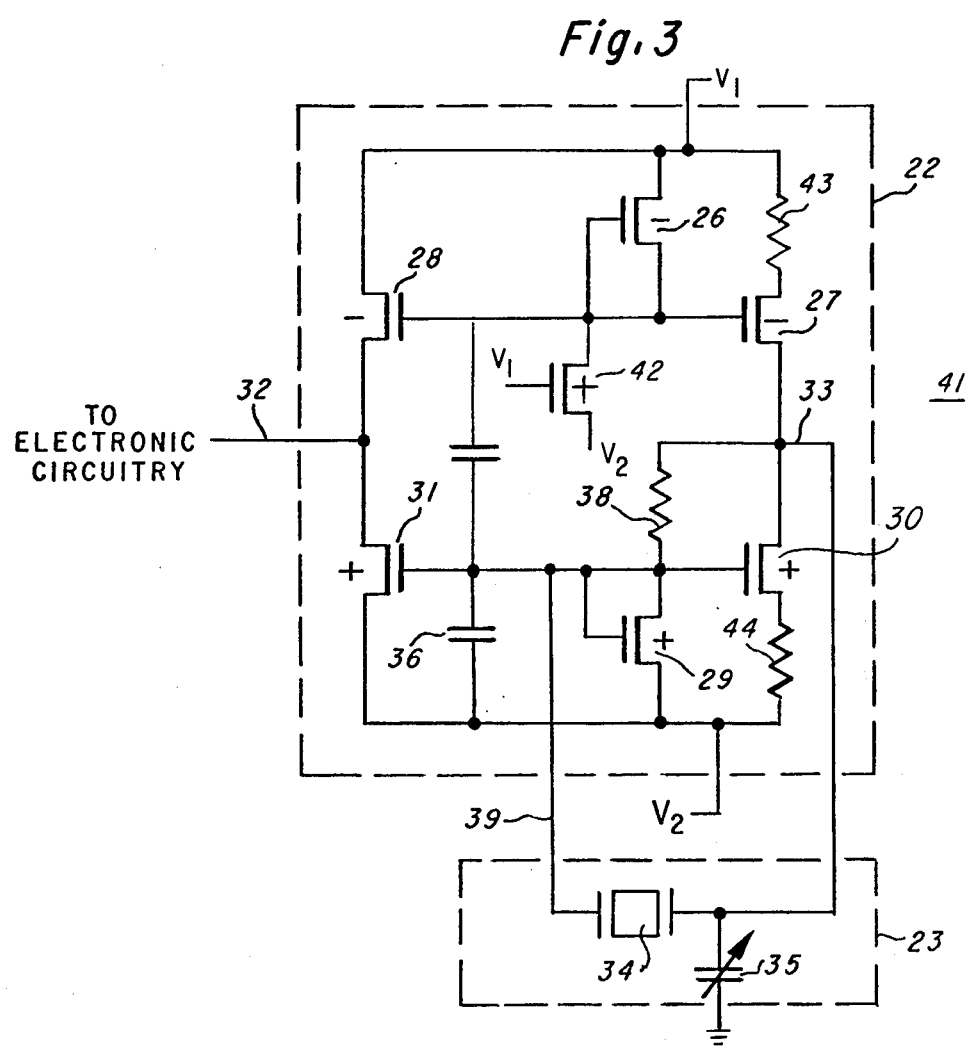
FIG. 3 is a circuit diagram of a second embodiment of a crystal oscillator system of the present invention.

Referring to FIG. 3, oscillator system 41 is depicted in which resistor 37 is removed and a P channel field effect transistor 42 coupled between V2 and node 24 with its gate connected to V1 is substituted therefor. Transistor 42 functions as a high impedance device and can be implemented within a smaller area of a semiconductor chip than can resistor 37. The substitution of transistor 42 for resistor 37 has the added advantage of decreasing the requisite voltage differential between V1 and V2 for effective oscillator operation. Resistors 43 and 44 serve to "pinch off" current flowing to crystal 34 via output 33, thereby reducing the magnitude of current fluctuations within the system.

Figure 4:
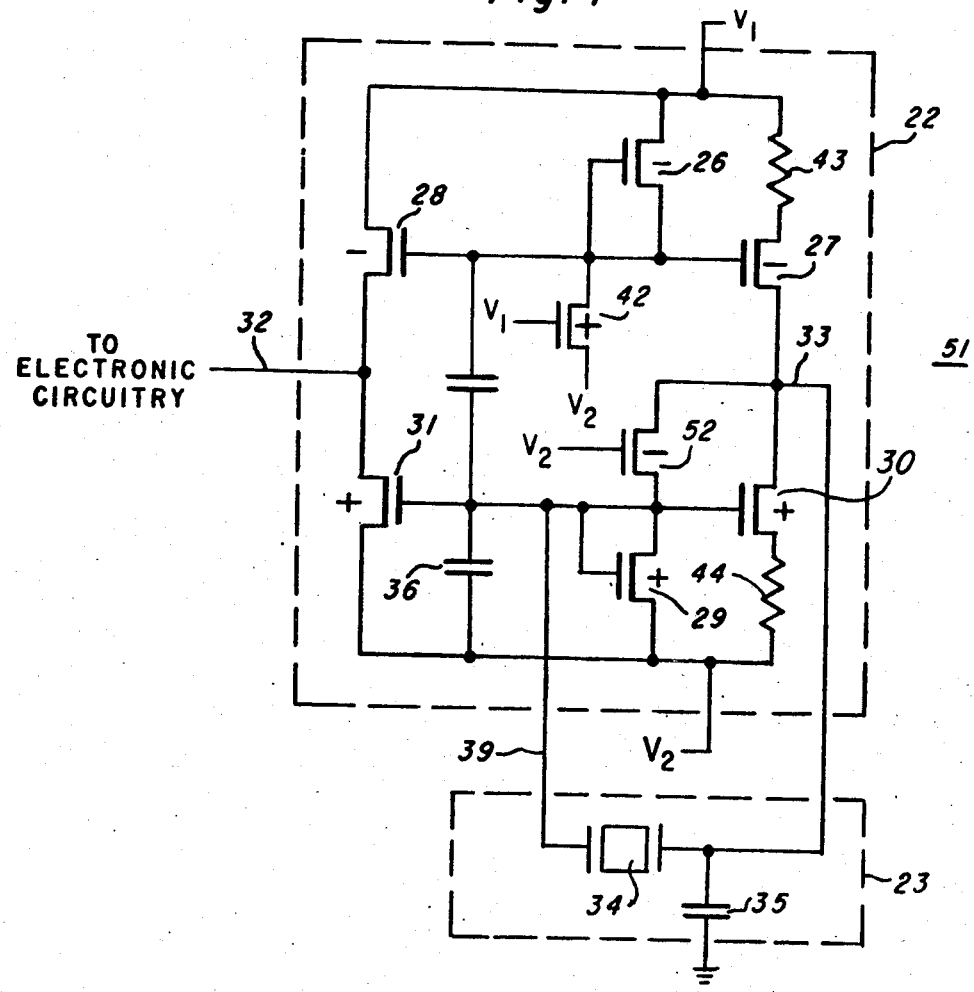
FIG. 4 is a circuit diagram of a third embodiment of a crystal oscillator system of the present invention.

Referring also to FIG. 4, a third embodiment of the invention is depicted. Oscillator system 51 is a modification of oscillator system 41 in which resistor 38 is removed and an N channel field effect transistor 52 is substituted therefor. N channel transistor 52 is coupled between storage node 25 and output 33 with its gate connected to V2. Transistor 52 functions as a high-impedance device along with transistor 42 for biasing devices 27 and 30 to a predetermined voltage and for maintaining sufficient current flow within the system and can be implemented within a smaller chip area than resistor 38.

Control circuit 22 is preferably implemented on a single semiconductor chip. The total gain of the oscillator system during each cycle is equivalent to the gain of control circuit 22 multiplied by the gain of tuning element 23. Since the gain of tuning element 23 is typically less than one, the gain of control circuit 22 must be substantially greater than one to ensure that the overall gain of the system is greater than one to build up the oscillating signal to the desired amplitude. Because nodes 24 and 25 are maintained at substantially different voltages during the operation of the oscillator system, devices 26, 27 and 28 are not turned on at the same time as devices 29, 30, and 31, thereby inhibiting the flow of direct current from V2 to V1. The oscillator system of the present invention is particularly well suited for use in a small, battery-powered electronic timepiece or electronic calculator in which reduction of current consumption is critical for sustaining battery life and eliminating the need for frequency battery replacement. The oscillator system of the present invention consumes approximately 0.5 microamp of current as compared to 1.0 microamp or greater for oscillators presently used in such electronic devices.

Figure 5:
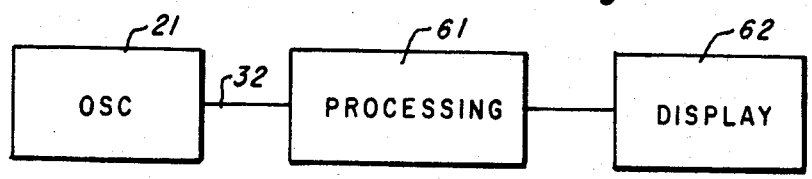
FIG. 5 is a block diagram of an electronic data processing system which includes the oscillator system of the present invention.

FIG. 5 depicts an electronic data processing system, such as an electronic timepiece, calculator, or other computing device containing oscillator system of the present invention as a part thereof. The output of oscillator 21 is typically a 32.768 KHz square wave signal, which is divided down within processing circuit 61 to provide the requisite clocking signals for the operation of the data processing system. Information computed by processing circuit 61 is transmitted to display 62 for the display of selected information.

Various embodiments of the invention have now been described in detail. Since it is obvious that many changes and modifications can be made in the above details without departing from the nature and spirit of the invention, it is understood that the invention is not to be limited to these details except as set forth in the appended claims.

What is claimed is:

1. An electronic oscillator system comprising:
(a) an oscillator frequency determining element having a predetermined operating frequency, said frequency determining element having first and second terminals;
(b) an oscillator control circuit connected to said frequency determining element for generating an oscillatory electrical signal at said predetermined operating frequency, said control circuit comprising:
  (i) a first charge storage node coupled to said first terminal of said frequency determining element;
  (ii) a first current drive means connected to said first charge storage node, said second terminal of said frequency determining element and to a first applied voltage, said first current drive means applying a first drive current to said second terminal of said frequency determining element proportional to the voltage on said first charge storage node, said first current drive means further comprising first and second field effect devices of a first conductivity type, said first field effect device having its source connected to said first applied voltage and having its gate and drain commonly connected to said first charge storage circuit node and said second field effect device having its source connected to said first applied voltage, its gate connected to said first charge storage circuit node and its drain connected to said second terminal of said frequency determining element;
  (iii) a second charge storage circuit node;
  (iv) a second current drive means connected to said second charge storage circuit node, said second terminal of said frequency determining element and to a second applied voltage, said second current drive means applying a second drive current to said second terminal of said frequency determining element proportional to the voltage on said second charge storage circuit node, said second current drive means further comprising third and fourth field effect devices of a second conductivity type differing from said first conductivity type, said third field effect device having its source connected to said second applied voltage and having its gate and drain commonly connected to said second charge storage circuit node, said fourth field effect device having its source connected to said second applied voltage, its gate connected to said second charge storage circuit node and its drain connected to said second terminal of said frequency determining element;

(v) a low impedance AC path between said first and second charge storage circuit nodes;

(vi) a high impedance DC path between said first charge storage circuit node and said second terminal of said frequency determining element which comprises a field effect device of said second conductivity type having its source connected to said first charge storage circuit node, its gate connected to said first applied voltage and its drain connected to said second terminal of said frequency determining element; and (vii) a high impedance DC biasing means coupled to said second charge storage circuit node.

2. An electronic oscillator system comprising:

(a) an oscillator frequency determining element having a predetermined operating frequency, said frequency determining element having first and second terminals;

(b) an oscillator control circuit connected to said frequency determining element for generating an oscillatory electrical signal at said predetermined operating frequency, said control circuit comprising:

(i) a first charge storage node coupled to said first terminal of said frequency determining element;

(ii) a first current drive means connected to said first charge storage node, said second terminal of said frequency determining element and to a first applied voltage, said first current drive means applying a first drive current to said second terminal of said frequency determining element proportional to the voltage on said first charge storage node, said first current drive means further comprising first and second field effect devices of a first conductivity type, said first field effect device having its source connected to said first applied voltage and having its gate and drain commonly connected to said first charge storage circuit node and said second field effect device having its source connected to said first applied voltage, its gate connected to said first charge storage circuit node and its drain connected to said second terminal of said frequency determining element;

(iii) a second charge storage circuit node;

(iv) a second current drive means connected to said second charge storage circuit node, said second terminal of said frequency determining element and to a second applied voltage, said second current drive means applying a second drive current to said second terminal of said frequency determining element proportional to the voltage on said second charge storage circuit node, said second current drive means further comprising third and fourth field effect devices of a second conductivity type differing from said first conductivity type, said third field effect device having its source connected to said second applied voltage and having its gate and drain commonly connected to said second charge storage circuit node, said fourth field effect device having its source connected to said second applied voltage, its gate connected to said second charge storage circuit node and its drain connected to said second terminal of said frequency determining element;

(v) a low impedance AC path between said first and second charge storage circuit nodes;

(vi) a high impedance DC path between said first charge storage circuit node and said second terminal of said frequency determining element;

(vii) a high impedance DC biasing means coupled to said second charge storage circuit node; and (viii) an output buffer circuit having an output terminal, a fifth field effect device of said first conductivity type having its source connected to said first applied voltage, its gate connected to said first charge storage circuit node and its drain connected to said output terminal, and a sixth field effect device of said second conductivity type having its source connected to said second applied voltage, its gate connected to said second charge storage circuit node and its drain connected to said output terminal.

* * * * *